United States Patent [19]

Nakasuji et al.

[11] Patent Number: 4,743,766
[45] Date of Patent: May 10, 1988

[54] METHOD OF DRAWING A DESIRED PATTERN ON A TARGET THROUGH EXPOSURE THEREOF WITH AN ELECTRON BEAM

[75] Inventors: Mamoru Nakasuji, Yokohama; Izumi Kasahara, Numazu, both of Japan

[73] Assignees: Kabushiki Kaisha Toshiba, Kawasaki; Toshiba Machine Co., Ltd., Tokyo, both of Japan

[21] Appl. No.: 75,268

[22] Filed: Jul. 17, 1987

Related U.S. Application Data

[63] Continuation of Ser. No. 784,048, Oct. 4, 1985, abandoned.

[30] Foreign Application Priority Data

Oct. 9, 1984 [JP] Japan .................................. 59-211965
Sep. 3, 1985 [JP] Japan .................................. 60-194115

[51] Int. Cl.$^4$ ............................................. H01J 37/302
[52] U.S. Cl. ............................... 250/492.2; 250/398
[58] Field of Search ........................... 250/492.22, 398

[56] References Cited

U.S. PATENT DOCUMENTS 4,264,711 4/1981 Greeneich ...................... 250/492.22
4,463,265 7/1984 Owen et al. ...................... 250/492.2

FOREIGN PATENT DOCUMENTS 0097417 4/1983 European Pat. Off. .
2755399 12/1976 Fed. Rep. of Germany .
59-921 1/1984 Japan .

OTHER PUBLICATIONS

IBM Technical Disclosure Bulletin, vol. 25, No. 3A, Aug. 1982, p. 986, New York, US; N. G. Anantha et al.: "Proximity Correction In E—Beam Systems".
Journal of Vacuum Science & Technology, "Data Composition Method for Raster—Scan Exposure System", Masahiko Sumi et al. vol. 16, No. 6, Nov./Dec. 1979, pp. 1809-1813.
G. Owen and P. Rissman J. Application Phys. 54(6) Jun., 1983.

*Primary Examiner*—Carolyn E. Fields
*Assistant Examiner*—Jack I. Berman
*Attorney, Agent, or Firm*—Oblon, Fisher, Spivak, McClelland & Maier

[57] ABSTRACT

In a method of drawing a desired pattern on a target through exposure thereof with an electron beam, a pattern area on the target surface is defined by first units of exposed areas arranged in rows and columns and is exposed by a first electron beam. A background area other than the pattern area on the target surface is also defined by secondary units of exposed areas which are arranged in rows and columns, and is exposed by a secondary electron beam to compensate for the proximity effect. The secondary units have a size larger than that of the first units and the second electron beam forms on the target surface a second beam spot which is larger than the first beam spot formed on the target surface by the first electron beam so that the background area is exposed in a reduced period of time.

7 Claims, 3 Drawing Sheets

METHOD OF DRAWING A DESIRED PATTERN ON A TARGET THROUGH EXPOSURE THEREOF WITH AN ELECTRON BEAM

This application is a continuation of application Ser. No. 784,048 filed on Oct. 4, 1985, now abandoned.

BACKGROUND OF THE INVENTION

This invention relates to an improved method of electron beam lithography for applying an electron beam to a target and, more particularly, a method of electron beam lithography which can reduce proximity effect.

An electron beam exposure method of forming a pattern on a target such as a semiconductor wafer or a mask substrate by scanning the target surface with an electron beam, has attracted attention since it can form a very fine pattern on the target. This method, however, cannot form an accurate pattern smaller than 1 μm width due to the proximity effect, i.e., the scattering of the electron beam in the target. A method for compensating for the inter proximity effect is disclosed in, for instance, G. Owen & Rissman, J. Appl. Phys. 54 (6) p-3573 (1983). In this method, an electron beam is applied to a target, thus exposing the target to a desired pattern at a predetermined dose. An electron beam of less dose, forming on the target an electron beam spot greater than the beam spot formed by the electron beam for drawing the pattern, is then applied to the non-pattern area (or background) at a reduced dose.

However, when this method is carried out, using a prior art electron beam exposure apparatus, two exposure steps are necessary, i.e., exposing the desired pattern area and effecting compensation exposure (or inverse exposure) of the non-pattern area. In this case, the exposure throughput is low. Particularly, where the target is exposed by a raster scanning method, the exposure throughput is reduced to one half. Where the target is exposed by a vector scanning method, the compensation exposure (i.e., inverse exposure) of the non-pattern area requires approximately three times the period for exposing the pattern area since the area ratio of the pattern area is approximately one-third the total exposed area of the target. Further, in any exposure method noted above, a computer must be operated for a long time in which CAD data format is converted to EB format.

SUMMARY OF THE INVENTION

An object of the invention is to provide an electron beam exposure method, which can eliminate the reduction of the pattern accuracy due to the inter-proximity effect and also improve the exposure throughput.

According to the invention, the unit of exposed area can be changed in exposing the pattern area and non-pattern area, i.e., background area.

More specifically, according to the invention there is provided an electron beam exposure method for selectively exposing a target to a desired pattern by irradiating the target with an electron beam, in which the pattern area of the target is exposed at a predetermined dose, using small unit of exposed areas and an electron beam having a small spot size corresponding to the size of the unit of exposed area, and the background area is exposed at a reduced dose, using larger pixels and using an unfocused electron beam having a greater spot corresponding to the broadening by electron scattering in the target.

BRIEF DESCRITION OF THE DRAWINGS

DETAILED DESCRIPTION OF THE PREFERRED EMBODIMENT

Figure 1:
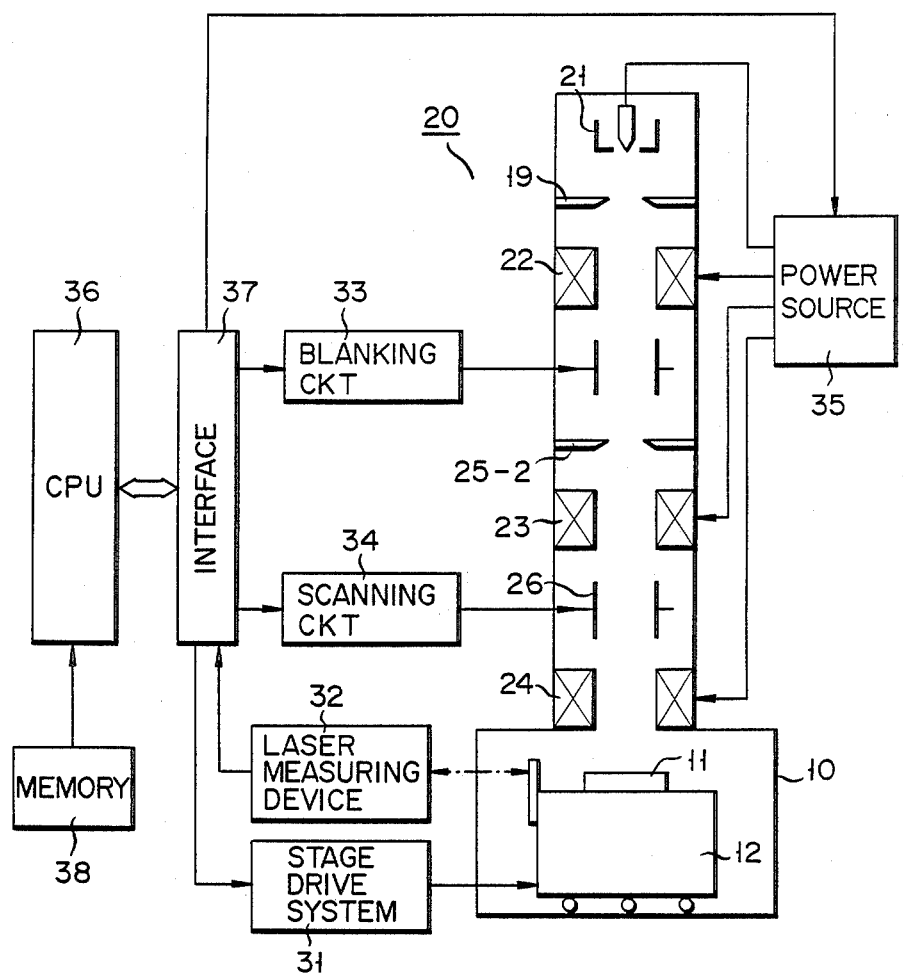
FIG. 1 is a block diagram showing an electron beam exposure apparatus for carrying out a method according to the invention.

FIG. 1 is a block diagram of an electron beam exposure apparatus for carrying out a method according to the invention. This apparatus has a target stage 12 supporting a target or sample 11, e.g., a semiconductor wafer. The target 12 is accommodated in a target chamber 10 and can move in X-direction (i.e., to the right and left of the paper) and Y-direction (i.e., into and out of the paper). The position of the stage 12 is detected by a laser sensor 32.

An electron beam optical column 20 is provided above the target chamber 10. It includes an electron gun 21, electron lenses 22 to 24 and deflectors 25 and 26. The gun 21 emits an electron beam. The beam passes through an aperture mask 19 and is converged by the electron lens 22 functioning as a condenser lens. The deflector 25 deflects the beam toward a blanking plate 25-2. The deflector 25 is driven by a blanking signal applied from a blanking circuit 33. The deflector 26 deflects the electron beam coming from the aperture of the blanking plate 25-2, in accordance with a scanning signal supplied from a scanning circuit 34. The electron beam is then converged by the electron lens 24 functioning as an objective lens. The converged beam scans the target 11 in the X- and Y-directions. The resist layer formed on the target 11 is exposed. The blanking signal and scanning signal are generated by a CPU 36 according to pattern data of a pattern to be drawn on the target 11. These signals are supplied through an interface 37 to the blanking circuit 33 and scanning circuit 34. The desired pattern is thus drawn on the target 11.

A power source 35 supplies power to the electron gun 21, lenses 22 to 24, CPU 36, etc.

An electron beam exposure method, or raster scanning, using the above apparatus will now be described with reference to FIGS. 2 and 3.

Figure 2:
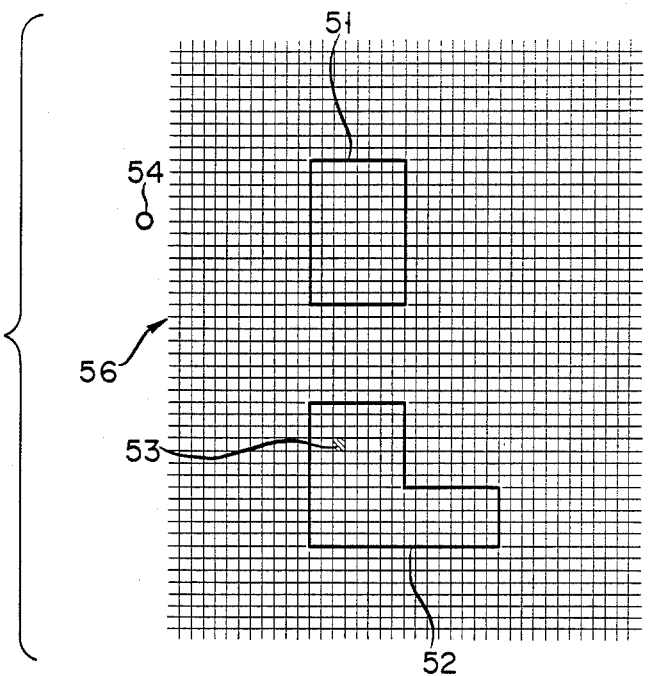
FIGS. 2 and 3 are views for explaining an embodiment of the electron beam exposure method according to the invention based on a raster scanning system using the apparatus shown in FIG. 1.

The surface of the target 11 is assumed to be an aggregate of areas arranged in one plane in rows and columns, as shown in FIG. 2. The patterns (i.e., pattern areas) 51 and 52 to be formed on the target 11 are each assumed to be an aggregate of these areas arranged in the same manner. To form the patterns 51 and 52 shown in FIG. 2 on the target 11, the electron beam is blanked for the areas constituting the background area, while the areas constituted by the areas corresponding to the patterns are scanned with the converged electron beam. The resist layer of the target is thus irradiated with a small electron beam spot. Pattern data which consists of scanning data and blanking data for these areas constituting the patterns is stored in a memory 38. This data is processed in the CPU 36. The processed data is supplied through the interface 37 to the blanking circuit and scanning circuit. The blanking circuit 33 generates a blanking signal, and the scanning circuit 34 generates a scanning signal. The target is thus scanned with the electron beam along scanning lines, whereby the patterns are drawn on the target.

Figure 3:
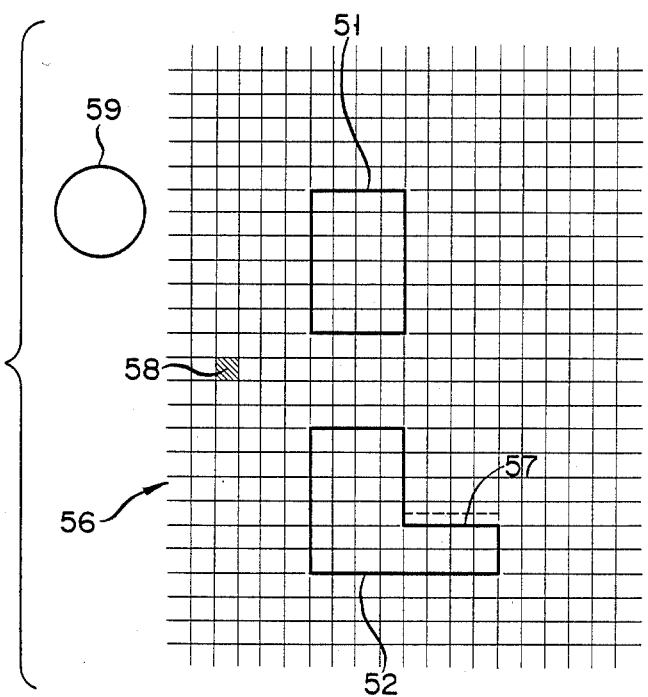

Meanwhile, as shown in FIG. 3, the background area 56 is irradiated with an defocused beam spot 59 larger than the beam spot 54 used to draw the patterns. (The large beam spot has a Gaussian distribution.) In other words, the area is scanned with an out-of-focus electron beam provided by controlling the currents supplied to the electron gun 21 and objective lens 24, after the patterns have been drawn on the target 11. As shown in FIG. 3, the background area 56 of the target 11 is expressed as an aggregate of the unit of exposed area 58 which is larger than the unit of exposed area shown in FIG. 2. To expose the background area 56, background data is provided from the memory 38 through the CPU 36 and interface 37 to the blanking circuit 33 and scanning circuit 34 for repeated electron beam scanning and blanking.

The time necessary for the exposure of one area is fixed irrespective of the size of the area. Therefore, the time necessary for exposing the background exposure will be much shorter than the time necessary for the pattern exposure. Further, when the pattern area 52 is expressed as an agregate of the large areas shown in FIG. 3, it will have a size greater by the area 57 shown by dashed line. However, this does not mean a reduction of the sharpness of the pattern but only means an increase of the dose for this area 57.

In the method described above, the areas size is increased when exposing the background area 56. Therefore, the time necessary for the exposure of the background area 56 is reduced. For example, when the size of the areas shown in FIG. 3 is twice as large as those shown in FIG. 2, the background area 56 can be exposed in a period of time about four times shorter than the time necessary for the exposure of the pattern areas 52. The exposure time can thus be considerably reduced.

Further, the number of unit of exposed area corresponding to the background data for the exposure of the background is sufficiently reduced. Therefore, the data conversion time and also the time for transferring the data from the CPU can be reduced. Thus, it is possible to greatly improve the speed of exposure of the background area.

An electron beam exposure method based on a vector system using the above apparatus will now be described with reference to FIGS. 4 and 5.

Figure 4:
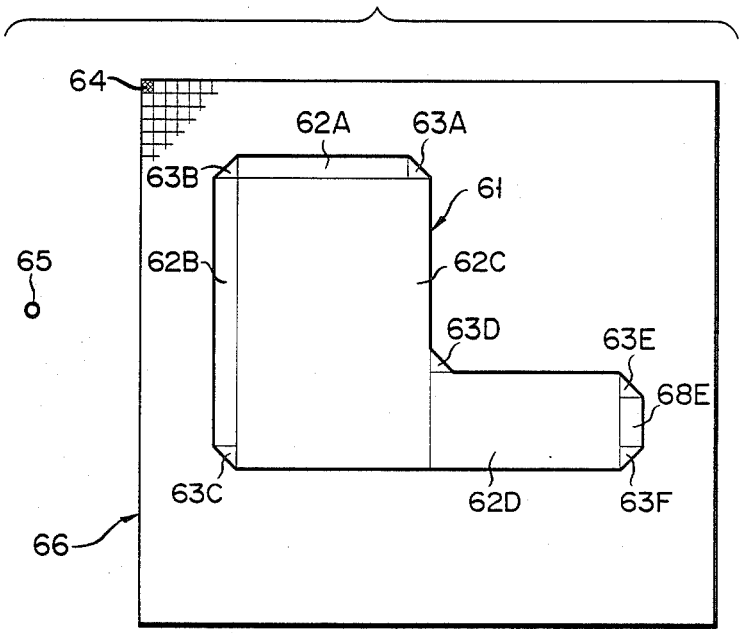
FIGS. 4 and 5 are diagrams explaining another electron beam exposure method according to the invention, i.e., a vector scan using the apparatus shown in FIG. 1.

Unlike the raster scanning method, a pattern (i.e., a pattern area) 61 to be formed on a target 11, as shown in FIG. 4, is expressed as an aggregate of five rectangles 62A to 62E and six triangles 63A to 63F. The individual pattern elements 62A to 63E and 63A to 63F are each expressed as an aggregate of the unit of exposed area 64. The pattern area 61 is exposed by performing progressive vector scanning on the unit of exposed area 64 of its elements 62A to 62E and 36A to 63F, using an electron beam spot 65 having substantially the same area as each unit of exposed area 64 and formed by focusing the electron beam on the target 11.

Figure 5:
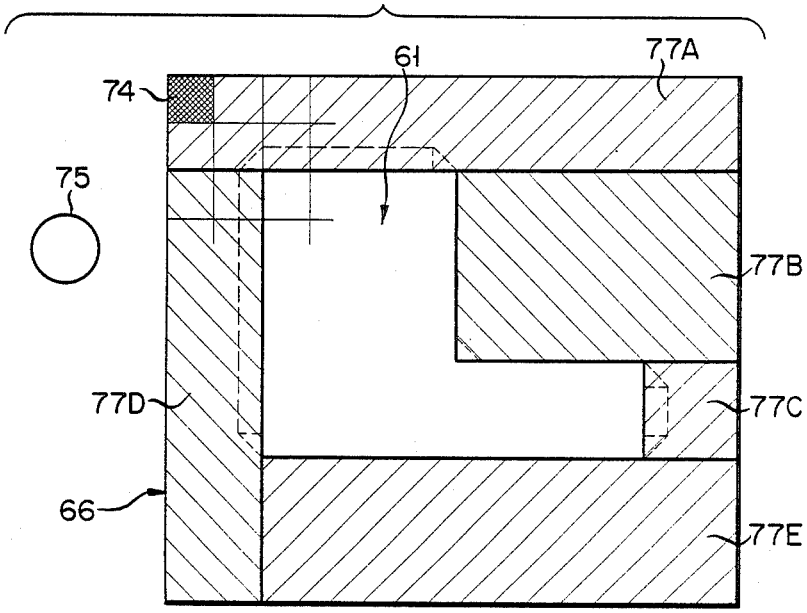

Meanwhile, for the exposure of the background area 66 the target is vector scanned with an defocused beam spot 75, which has greater area than the beam spot 65 for drawing the pattern as shown in FIG. 5, the beam spot 75 having a Gaussian distribution. That is, in this case, the electron beam is out-of-focuse on the target, and the electron beam spot formed on the target is enlarged and controlled to give reduced dose. The background area consists of a plurality of divisions or segments 77A to 77E each expressed as an aggregate of pixels 74 larger than the unit of exposed area 64 shown in FIG. 4. The background area is exposed by performing progressive vector scanning on the unit of exposed area 74 of its divisions 77A to 77F, using an electron beam spot 75 having substantially the same size as that of the broadening of electron scattering in the target.

Since the time necessary for the exposure of one unit of exposed area is fixed irrespective of the size of the pixel as noted before, the time necessary for exposing the background area can be reduced by expressing the background area as an agregate of larger unit of exposed area as shown in FIG. 5. By setting a greater unit of exposed area size for the background area the data conversion time in the CPU and time for data transfer from the CPU can be reduced. Besides, the background area is divided into a small number of divisions or segments 77A to 77E. It is thus possible to expose the background area at higher speed.

As has been shown, in the vector scanning method, the unit of exposed area size is increased when exposing the background area 66, so that the time necessary for the exposure of the background area 66 can be reduced. For example, when the unit of exposed area 74 of the background area 66 are four times larger than the unit of exposed area 64, the time necessary for the exposure of the background area can be reduced to approximately one-sixteenth. Thus, it is possible to greatly improve the through-put of the exposure.

As an example, a pattern area with a unit area of exposure size of 1 $\mu$m and having a line width of 1.1 $\mu$m was exposed with an electron beam spot diameter of 0.1 $\mu$m using a drawing apparatus, and then the following methods were adopted.

(1) The background was not exposed at all, that is, the inter-proximity effect compensation was not made.

(2) The inter-proximity effect compensation by the background exposure was done using an out-of-focused electron beam spot of 3 $\mu$m in diameter and without changing the area of exposure size from 0.1 $\mu$m.

(3) The proximity effect compensation by the background was done by excluding portions thereof less than 0.2 $\mu$m in width and using an out-of-focused electron beam spot of 3 $\mu$m in diameter while changing the area of exposure size from 0.1 $\mu$m to 0.2 $\mu$m.

(4) The proximity effect compensation by the background exposure was done by including portions thereof less than 0.2 $\mu$m in width even if they overlap the pattern area and using an out-of-focused electron beam spot of 3 $\mu$m in diameter while changing the unit area of exposure size from 0.1 $\mu$m to 0.2 $\mu$m.

Afterwards, development was done under conditions that pattern portions of designed width 5 $\mu$m or above were developed to the designed width. In the first case (1) of drawing the pattern without the inter proximity effect compensation, pattern portions of designed width 1.1 $\mu$m in width were developed as thinner pattern portions of 0.8 $\mu$m width. In any of the cases (2) to (4) where the proximity effect compensation was done, the same pattern portions were developed as patterns with width ranging from 1.07 to 1.13 $\mu$m. The results in the latter three methods were such that the differences from one another were substantially ignorable.

Where the target is a silicon wafer, the diameter of the electron beam spot for exposing the background area is suitably 2 to 6 μm when the electron beam acceleration voltage is 20 KeV, and it increases with increasing electron beam acceleration voltage. The diameter of the electron beam spot for the exposure of the pattern area usually ranges from 0.1 to 0.5 μm. Therefore, a practical range of the unit area of exposure size ratio between the background area and pattern area is between 2 and 8. The lower limit 2 of N is set because if N is close to 1 a high throughput cannot be obtained. The upper limit 8 of N is determined as such for the unit of exposed area size of the background area should not be too large with respect to the diameter of the electron beam spot for the exposure of the background.

As has been described above, the non-pattern area is exposed by setting an increased pixel size, thus reducing the exposure time necessary. Since the unit area of exposure size is increased for the proximity effect compensation exposure, the time necessary for the formation of an inverse pattern can be significantly reduced. The throughput of the entire exposure can thus be improved.

The above embodiment of the method is by no means limitative. For example, it is possible to reverse the order of the pattern exposure and background exposure. Further, the unit area of exposure's size for the background exposure may be suitably varied according to the diameter of the electron beam spot for this exposure. Further, the electron beam exposure apparatus for carrying out the method according to the invention is not limited to the one shown in FIG. 1, it may be suitably modified according to given specifications. For example, the invention is applicable to an electron beam exposure apparatus of variable shaped electron beam type where the size and shape of the electron beam is variable. Various other changes and modifications may be made without departing from the scope and spirit of the invention.

What is claimed is:

1. An electron beam exposure method for selectively exposing a target to a desired pattern through irradiating of the target surface with an electron beam comprising the steps of:

exposing the area of the target surface corresponding to either a pattern or a background other than the pattern with an electron beam; and exposing an area of the target surface other than the afore-said area with an electron beam;

the exposure of the pattern area at a predetermined first dose being performed by setting first unit of exposed area, having a certain size constituting the pattern and using an electron beam having a first spot size corresponding to said first unit of exposed area; and wherein the exposure of the background area at a predetermined second dose is controlled by a stored pattern which is stored by using a fewer number of bits to define the exposed surface than is used to define the exposed surface during the exposure of the pattern area and wherein said background exposure is performed by setting the second unit of exposed area, having N (N>1) times the size of the first unit of exposed area.

2. The electron beam exposure method according to claim 1, wherein N is in the range of $2 \leq N \leq 8$.

3. The electron beam exposure method according to claim 8, wherein pattern area segments smaller than the second unit of exposed area when the pattern area is defined by second unit of exposed area for the exposure of the background area are included in the background area.

4. The electron beam exposure method according to claim 1, wherein pattern area segments smaller than the second unit of exposed area when the pattern area is defined by second unit of exposed area for the exposure of the background area are not included in the background area.

5. The electron beam exposure method according to claim 1, wherein said electron beam has a variable shape.

6. The electron beam exposure method according to claim 1, wherein said electron beam is used for raster scanning.

7. The electron beam exposure method according to claim 1, wherein said electron beam is used for vector scanning.

* * * * *